United States Patent
Qing

(10) Patent No.: US 10,199,119 B2
(45) Date of Patent: Feb. 5, 2019

(54) SHIFT REGISTER UNIT, SHIFT REGISTER, GATE DRIVING CIRCUIT AND DISPLAY DEVICE

(71) Applicants: BOE Technology Group Co., Ltd., Beijing (CN); Chengdu BOE Optoelectronics Technology Co., Ltd., Chengdu (CN)

(72) Inventor: Haigang Qing, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 15/514,013

(22) PCT Filed: Apr. 22, 2016

(86) PCT No.: PCT/CN2016/079946
§ 371 (c)(1),
(2) Date: Mar. 24, 2017

(87) PCT Pub. No.: WO2017/133084
PCT Pub. Date: Aug. 10, 2017

(65) Prior Publication Data
US 2018/0151241 A1    May 31, 2018

(30) Foreign Application Priority Data
Feb. 2, 2016    (CN) .......................... 2016 1 0074525

(51) Int. Cl.
*G11C 19/18*    (2006.01)
*G09G 3/32*    (2016.01)
(Continued)

(52) U.S. Cl.
CPC ............. *G11C 19/182* (2013.01); *G09G 3/32* (2013.01); *G09G 3/3266* (2013.01);
(Continued)

(58) Field of Classification Search
CPC ................... G11C 19/182; G09G 3/32; G09G 2310/0243; G09G 2310/0286
See application file for complete search history.

(56) References Cited

U.S. PATENT DOCUMENTS

2008/0285705 A1    11/2008 Wei et al.
2015/0036784 A1    2/2015 Qing et al.
(Continued)

FOREIGN PATENT DOCUMENTS

CN    102682692 A    9/2012
CN    103198783 A    7/2013
(Continued)

OTHER PUBLICATIONS

First Office Action for Chinese Patent Application No. 201610074525.9 dated Sep. 5, 2017.
(Continued)

*Primary Examiner* — Charles Hicks
(74) *Attorney, Agent, or Firm* — Calfee, Halter & Griswold LLP

(57) ABSTRACT

A shift register unit, a shift register, a gate driving circuit and a display device are discloses. The shift register unit has an output node Out(n) of a current stage, a pull-up node PU and a pull-down node PD, and the shift register unit includes a first capacitor module C1, a pull-down module and a pull-down control module, and the pull-down control module is configured to output one of a high level signal and a low level signal to the pull-down node (PD) in accordance with a current operating phase.

20 Claims, 6 Drawing Sheets

(51) Int. Cl.
*G11C 19/28* (2006.01)
*G09G 3/3266* (2016.01)
*G09G 3/36* (2006.01)

(52) U.S. Cl.
CPC ......... *G09G 3/3677* (2013.01); *G11C 19/184* (2013.01); *G11C 19/28* (2013.01); *G09G 2310/0243* (2013.01); *G09G 2310/0267* (2013.01); *G09G 2310/0286* (2013.01)

(56) References Cited

U.S. PATENT DOCUMENTS

| | | |
|---|---|---|
| 2015/0318052 A1 | 11/2015 | Li |
| 2016/0232865 A1 | 8/2016 | Hao et al. |
| 2017/0025068 A1* | 1/2017 | Jeoung .................. G11C 19/28 |

FOREIGN PATENT DOCUMENTS

| | | |
|---|---|---|
| CN | 103366704 A | 10/2013 |
| CN | 103985341 A | 8/2014 |
| CN | 105513525 A | 4/2016 |
| WO | 2013026387 A1 | 2/2013 |

OTHER PUBLICATIONS

International Search Report and Written Opinion for International Application No. PCT/CN2016/079946 dated Nov. 10, 2016.

* cited by examiner

SHIFT REGISTER UNIT, SHIFT REGISTER, GATE DRIVING CIRCUIT AND DISPLAY DEVICE

CROSS-REFERENCE TO RELATED APPLICATIONS

The present application is based on International Application No. PCT/CN2016/079946, filed on Apr. 22, 2016, which is based upon and claims priority to Chinese Patent Application No. 201610074525.9, filed Feb. 2, 2016, the entire contents of which are incorporated herein by reference.

TECHNICAL FIELD

The present disclosure relates to shift register technology, and in particular to a shift register unit, a shift register, a gate driving circuit, and a display device.

BACKGROUND

A shift register unit in a related art includes a pull-up transistor. The pull-up transistor is responsible for utilizing a high level signal to pull up a potential of a pull-up node during a charging phase, and charges a first capacitor module, to maintain an output transistor T1 to be turned on during an outputting phase and output a high level signal. The pull-up node and an output node of a current stage need to be maintained in a low level state during the subsequent reset phase and maintaining phase.

According to the timing design in the related art, since a CKB node has to output a high level during the reset phase, and the CKB node has a clock signal, the CKB node may also output a high level signal to the pull-down node PD during the charging phase separated from the reset phase.

However, during the charging phase, the introduction of the high level signal inevitably leads to a problem of insufficient turning off by pulling down. In addition, an instantaneous high current may be generated, increasing the power consumption of the device and possibly causing damage to the device.

SUMMARY

An object of an embodiment of the present disclosure is to provide a shift register unit, a shift register, a gate driving circuit and a display device.

An embodiment of the present disclosure discloses a shift register unit having an output node Out(n) of a current stage, a pull-up node PU and a pull-down node PD, the shift register unit including:

a first capacitor module C1 having one end connected to the output node Out(n) of the current stage and the other end connected to the pull-up node PU; and a pull-down module, which is controlled by a potential of the pull-down node PD, and configured to pull down a potential of the output node Out(n) of the current stage and a potential of the pull-up node PU when a circuit of the current stage does not need to output a high level.

An embodiment of the present disclosure further discloses a shift register which is formed by the cascaded shift register units described as above.

An embodiment of the present disclosure further discloses a gate driving circuit including the shift register described as above.

An embodiment of the present disclosure further discloses a display device including the gate driving circuit described as above.

BRIEF DESCRIPTION OF THE DRAWINGS

In order to more clearly illustrate the technical solution of the embodiments of the present disclosure, the drawings referred to in the description of the embodiments of the present disclosure will be briefly described below. It will be apparent that the drawings in the following description are merely examples of the present disclosure. It will be apparent to those skilled in the art that other drawings may be obtained without creative labor.

DETAILED DESCRIPTION

In order that the objects, technical solutions and advantages of the embodiments of the present disclosure become more apparent, the technical solutions of the embodiments of the present disclosure will be clearly and fully described below with reference to the accompanying drawings of the embodiments of the present disclosure. It is obvious that the described embodiments are part of the embodiments of the present disclosure, and are not all of the embodiments. All other embodiments obtained by those skilled in the art based on the described embodiments of the present disclosure are within the scope of the present disclosure.

Unless otherwise defined, technical and scientific terms used herein should have the same meaning as commonly understood by one of ordinary skill in the art to which this disclosure belongs. The "first", "second" and similar words used in the specification and the claims of the present disclosure are not meant to be in any order, quantity or importance, but merely to distinguish between different constituent parts. Similarly, similar words such as "one" do not represent limiting of a quantity, but represent that there is at least one. The words such as "connected" or "coupled" and the like are not limited to physical or mechanical connections, but may include an electrical connection, whether direct or indirect. The terms such as "upper", "lower", "left", "right" and the like are used only to represent a relative positional relationship, and when an absolute position of the described object changes, the relative positional relationship is changed accordingly.

Figure 1:
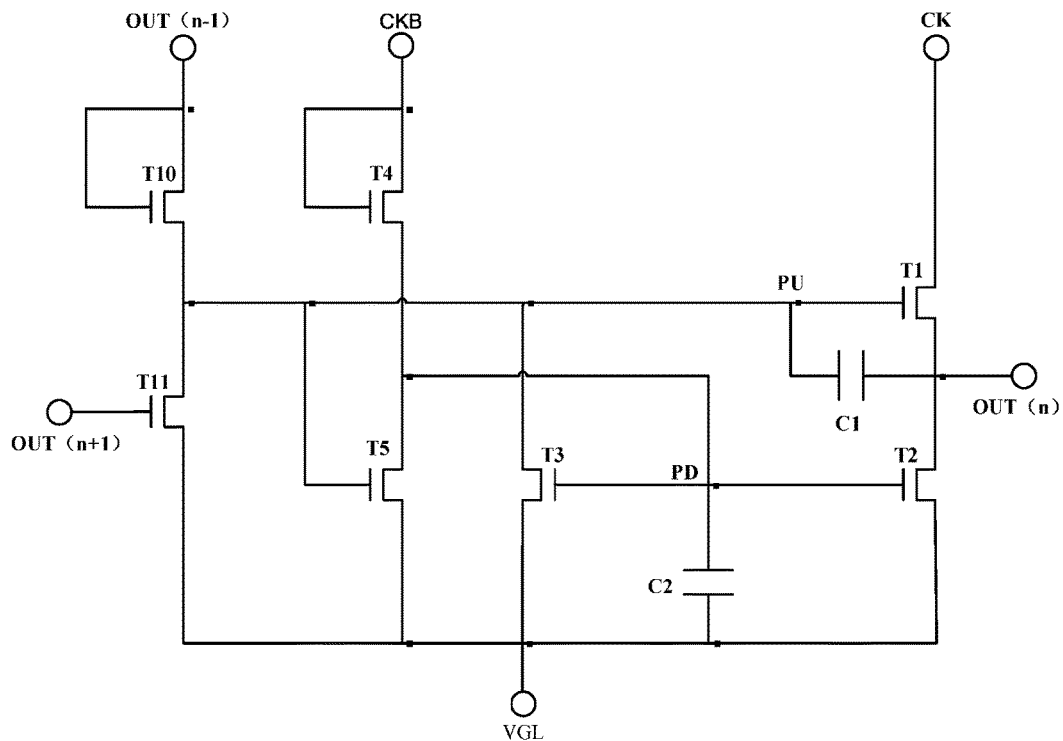
FIG. 1 shows a schematic diagram of a structure of a shift register unit in a related art.

FIG. 1 is a schematic diagram of a shift register unit in a related art, and as shown in FIG. 1, which includes a pull-up transistor T10. The pull-up transistor T10 is responsible for utilizing a high level signal (which is a high level signal output from a output node OUT(n-1) of a previous stage shown in FIG. 1, but it is not limited thereto) to pull up a potential of a pull-up node PU during a charging phase, and charges a first capacitor module C1, to maintain an output transistor T1 to be turned on during an outputting phase and output a high level signal (which is a high level signal output from a CK node shown in FIG. 1). The pull-up node PU and an output node Out(n) of a current stage need to be maintained in a low level state during the subsequent reset phase and maintaining phase.

To ensure that the pull-up node PU and the output node of the current stage Out(n) output a low level signal in the subsequent reset phase and a maintaining phase, the shift register unit in the related art further includes a first pull-down module (which is a thin film transistor T2 in FIG. 1) for pulling down a potential of the output node of the current stage and a second pull-down module (which is a thin film transistor T3 in FIG. 1) for pulling down a potential of the pull-up node.

The phases in which the pull-down node PD needs to be pulled up includes a reset phase and a maintaining phase, while the pull-down node PD needs to be pulled down during a charging phase and an outputting phase. The control of the pull-down node PD is achieved by thin film transistors T4 and T5 in FIG. 1. Since the CK node has a clock signal, the thin film transistor T4 may be turned on periodically, and the high level signal may be applied to the pull-down node PD periodically.

Figure 2:
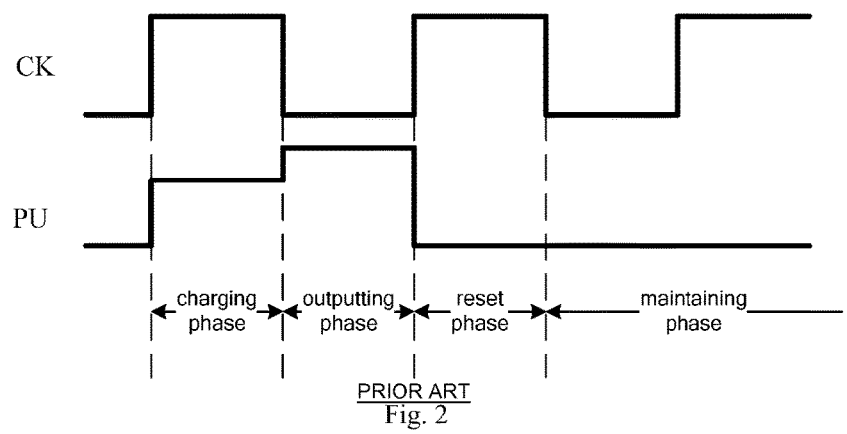
FIG. 2 shows a timing diagram of some signals of the shift register unit shown in FIG. 1.

According to the timing design shown in FIG. 2 in the related art, since a CKB node has to output a high level during the reset phase, and the CKB node has a clock signal, the CKB node may also output a high level signal to the PD during the charging phase separated from the reset phase.

However, since the pull-up node PU is in a high level during the charging phase, which may turn on the thin film transistor T5, the VGL node outputs a low level signal to the pull-down node PD through the thin film transistor T5.

That is, during the charging phase, the thin film transistors T4 and T5 may be simultaneously in a state of being turned on. The introduction of the high level signal inevitably leads to a problem of insufficient turning off by pulling down. In addition, when the thin film transistors T4 and T5 are turned on simultaneously, the thin film transistors T4 and T5 may form a circuit together with the CKB node (currently outputting a high level signal) and the VGL node (currently outputting a low level signal), and the discharging of the CKB node to the VGL node generates an instantaneous high current, increasing the power consumption of the device and possibly causing damage to the device.

In a specific embodiment of the present disclosure, it ensures that a signal output to the pull-down node is a high level signal or a low level signal during a charging phase, avoiding various problems caused by the simultaneous output of the high level signal and the low level signal to the pull-down node PD.

Prior to further explanation of the embodiments of the present disclosure, the concepts discussed with respect to the embodiments of the present disclosure are described below in order to better understand the embodiments of the present disclosure.

Take a shift register unit of a certain stage as an example, an operational process thereof generally includes the following four stages as shown in FIGS. 1 and 2.

During phase A (charging phase), an output node of a previous stage outputs a high level. A level of a pull-up node PU is initially pulled up by charging a first capacitor structure (also referred to as a bootstrap capacitor structure).

During phase B (outputting phase), the pull-up node PU which is continuously pulled up turns on a thin film transistor, and outputs a high level signal to an output node of a current stage, such that the output node of the current stage output the high level signal.

During phase C (reset phase), an output node of a next stage outputs a high level signal. The pull-up node PU and the output node of the current stage are pulled down by a low level signal.

During phase D (maintaining phase), until the next time that the output node of the previous stage outputs a high level, the low level of the pull-up node PU and the output node of the current stage is maintained by the low level signal.

Figure 3:
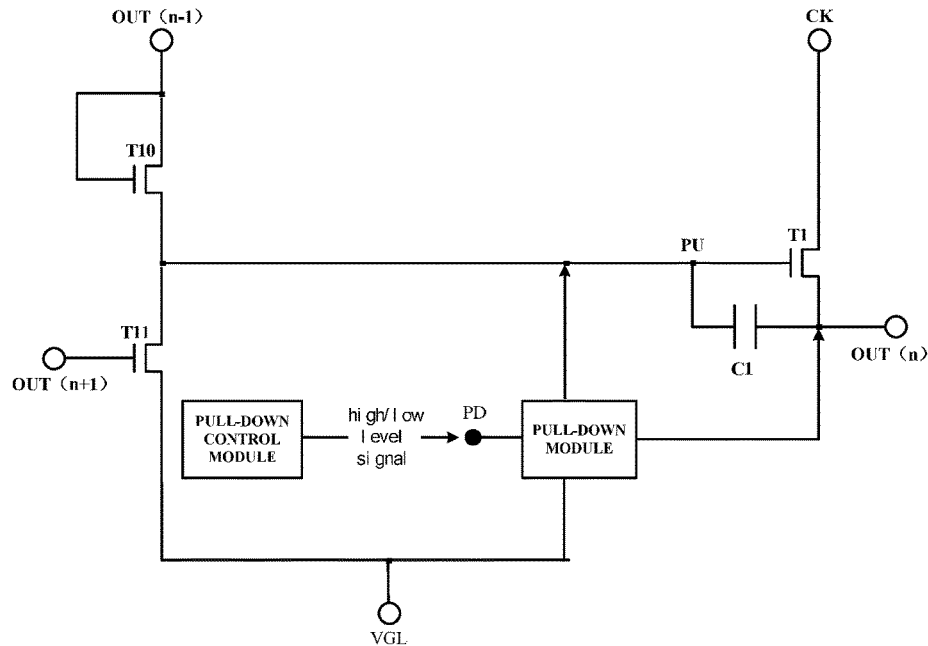
FIG. 3 shows a schematic diagram of a structure of a shift register unit according to an embodiment of the present disclosure.

In order to achieve the above objects, an embodiment of the present disclosure discloses a shift register unit having an output node Out(n) of a current stage, a pull-up node PU and a pull-down node PD, as shown in FIG. 3. The shift register unit includes:

a first capacitor module C1 having one end connected to the output node Out(n) of a current stage and the other end connected to the pull-up node PU; and a pull-down module, which is controlled by a potential of the pull-down node (PD), and is configured to pull down a potential of the output node Out(n) of the current stage and the pull-up node PU when a circuit of the current stage does not need to output a high level.

The shift register unit further includes:

a pull-down control module, configured to output one of a high level signal and a low level signal to the pull-down node PD in accordance with a current operating phase.

It is to be understood that, in the specific embodiments of the present disclosure, the high level signal and the low level signal may be outputted to the pull-down node PD through different electrical transmission channels. The pull-down control module in the specific embodiments of the present disclosure actually has a selection function, i.e. selecting one of the high level signal and the low level signal to output to the pull-down node PD.

The pull-down control module selects to output the low level signal during the charging phase and the outputting phase. However, during the reset phase and the maintaining phase, the output signal may be any one of a variety of manners including, but not limited to the following three manners.

As a first manner, the high level signal is continuously output to the pull-down node PD during the reset phase and the maintaining phase.

As a second manner, the high level signal is output to the pull-down node PD in the first period of time of the reset phase and the maintaining phase, and then the low level signal is output.

As a third manner, the high level signal and the low level signal are alternately output during the reset phase and the maintaining phase, and the first output signal is the high level signal.

In the second and third manners, as shown in FIG. 3, it can be seen that, as long as the low level signal is output to the pull-up node PU and the output node Out(n) of the current stage in the first period of time, the first capacitor structure C1 can be discharged, and the pull-up node PU and the output node Out(n) of the current stage can be pulled down. If the period of subsequently outputting the low level signal to the pull-up node PU and the output node Out(n) of the current stage is longer, the pull-up node PU and the output node Out(n) of the current stage will better maintain a state of low level.

As shown in FIG. 3, the pull-down module is affected by a potential of the pull-down node PD. The potential of the pull-down node PD is controlled by the pull-down control module. In the specific embodiment of the present disclosure, the pull-down control module outputs the high level signal or the low level signal to the pull-down node PD in accordance with the current operating phase, avoiding that the two signals are simultaneously output to the pull-down node PD, and ensuring that the pull-down module is in a right state.

In the specific embodiment of the present disclosure, the pull-down control module outputs the high level signal or the low level signal to the pull-down node PD in accordance with the current operating phase. Thus the instantaneous high current caused by the simultaneous output of the high and low level signals to the same node is avoided, which can reduce the power consumption of the product, avoid the product from being impacted by the instantaneous high current, effectively protect the device, and improve the lifetime of the device.

When entering the outputting phase from the charging phase, the voltage of the output node Out(n) of the current stage has a transition (i.e. jumping from a voltage of the low level signal to a voltage of the high level signal).

Referring to FIGS. 2 and 3, it can be seen that, since the transistors T10 and T11 are turned off during the outputting phase, one end of the first capacitor structure C1 close to the pull-up node PU is in a floating state. Due to the coupling effect of the first capacitor structure C1, the voltage transition of the output node Out(n) of the current stage may be coupled to the end of the first capacitor structure C1 close to the pull-up node PU, resulting that the voltage of the pull-up node PU continues to increase.

When the voltage of the high level signal to be output is large, the voltage of the pull-up node PU may be pulled to be very high during the outputting phase. The voltage of the pull-up node PU is too high to cause that the electric leakage in the transistor T11 and the pull-down module increases, such that the potential of the pull-up node PU declines rapidly, affecting the pull-up capability of the output end of the circuit of the current stage.

Figure 4:
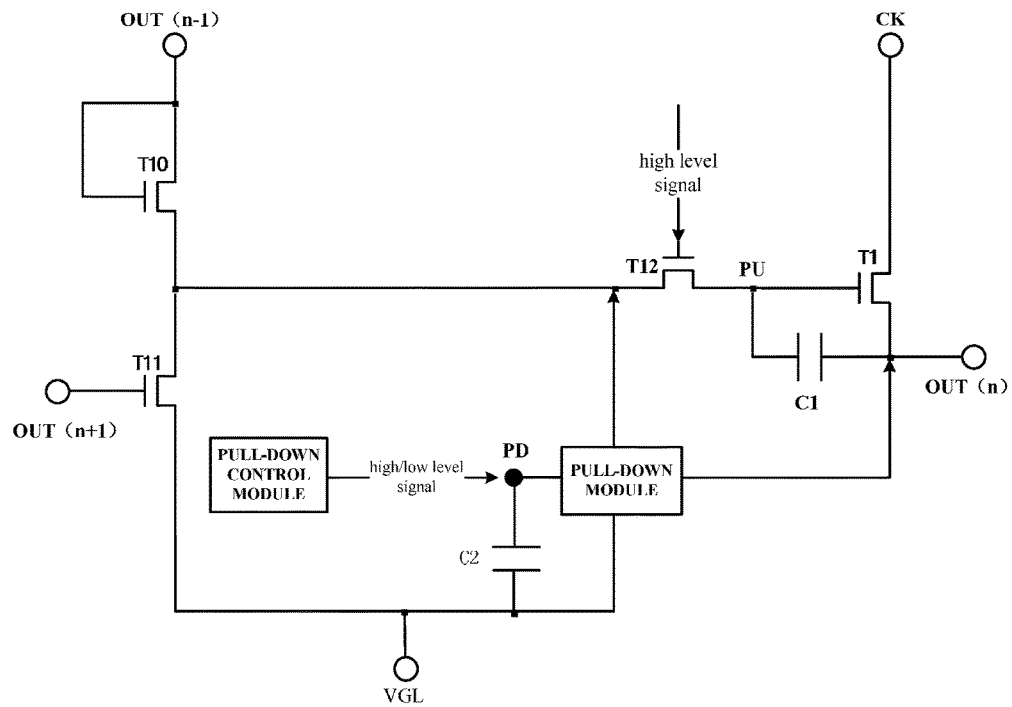
FIG. 4 shows a schematic diagram of a structure of a shift register unit provided with a second capacitor module according to an embodiment of the present disclosure.

To avoid this adverse effect, in the specific embodiment of the present disclosure, as shown in FIG. 4, a transistor T12 for limiting or clamping the current, which is normally turned on, is disposed between the pull-up transistor T10 and the pull-up node PU. When the voltage of the pull-up node PU is pulled to be high by the output end, the gate/source electrodes of the transistor T12 may form a reversely connected diode due to the equal potential, and enter into a turned-off state, thereby preventing the potential of the pull-up node PU from being decreased due to the electric leakage.

This effect will be further described in the following description, which is not described in detail herein.

In the specific embodiment of the present disclosure, it can be seen that the pull-down node PD needs to maintain a high level state during the reset phase and the maintaining phase shown in FIG. 2, such that the pull-down module continuously outputs the low level signal. Maintaining the pull-down node PD in a high level state may be achieved in several ways, and for example, the high level signal is continuously output to the pull-down node PD during the reset phase and the maintaining phase.

Another way is shown in FIG. 4, and the shift register unit further includes:

a second capacitor module C2, which is charged/discharged by the level signal output from the pull-down control module, and maintains the level state of the pull-down node PD after being charged/discharged.

In this way, the high level signal output by using the pull-down control module during the reset phase may charge the second capacitor module C2. The high level state of the pull-down node PD is maintained by the charged second capacitor module C2 during the subsequent stages. Therefore, it is possible to ensure that the pull-down node PD is in a high level during the entire reset and maintaining phases. That is, it is possible to ensure the pull-down module is in an operating state during the entire reset and maintaining phases. The potential of the output node Out(n) of the current stage and the pull-up node PU is continuously pulled down.

In the specific embodiment of the present disclosure, in order to ensure selective output of the high or low level signal, a specific implementation of the pull-down control module includes:

a first control unit, which, under a control of the pull-up node PU, outputs the low level signal to the pull-down node PD during the charging phase and the outputting phase in which the pull-up node PU is in a high potential, and is turned off during the reset phase and the maintaining phase in which the pull-up node PU is in a low potential; and a second control unit, which is turned off when the first control unit outputs the low level signal, and outputs the high level signal to the pull-down node PD when the first control unit is turned off.

It can be seen that these two control units (i.e., the first control unit and the second control unit) are respectively responsible for outputting the low level signal and the high level signal, the operations of which are mutually exclusive, that is, only one of which is in a working state and outputs a level signal, thereby ensuring the output of selected one of the high level signal and the low level signal.

Figure 5:
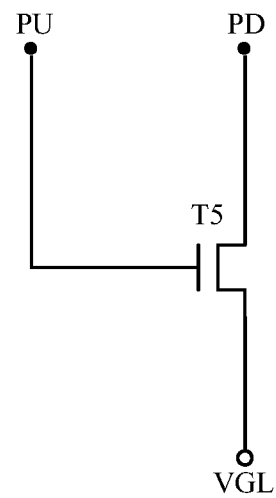
FIG. 5 shows a schematic diagram of a structure of a first control unit in a shift register unit according to an embodiment of the present disclosure.

As shown in FIG. 5, the first control unit described as above may be achieved directly by the fifth transistor T5, wherein a gate electrode of the fifth transistor T5 is connected to the pull-up node PU, a source electrode of the fifth transistor T5 receives a low level signal output from the VGL, and a drain electrode of the fifth transistor T5 connects to the pull-down node PD.

Figure 6:
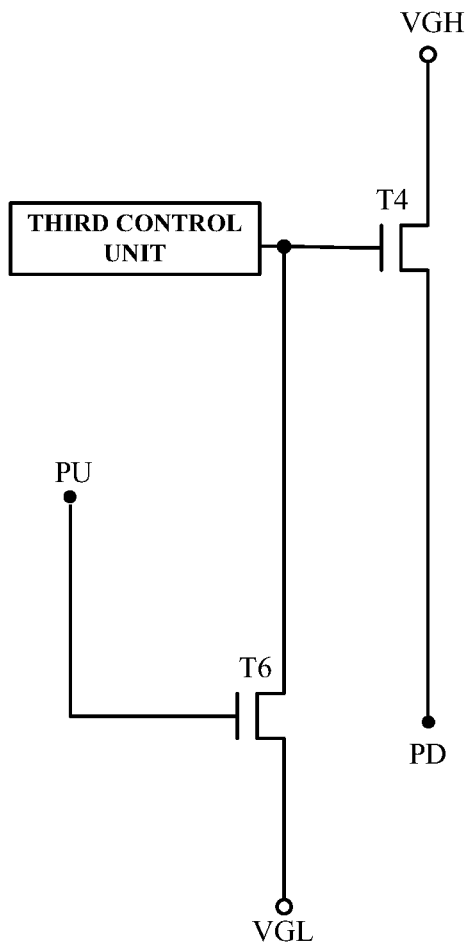
FIG. 6 shows a schematic diagram of a structure of a second control unit in a shift register unit according to an embodiment of the present disclosure.

As shown in FIG. 6, in particular, the second control unit described as above includes:

a sixth transistor T6, wherein a gate electrode of the sixth transistor T6 is connected to the pull-up node PU, and a source electrode of the sixth transistor T6 receives the low level signal;

a fourth transistor T4, wherein a drain electrode of the fourth transistor T4 receives the high level signal, a gate electrode of the fourth transistor T4 is connected to a drain electrode of the sixth transistor T6, and a source electrode of the fourth transistor T4 is connected to the pull-down node PD; and a third control unit, configured to output the high level signal to the pull-down node PD by controlling the fourth transistor T4 during the reset phase and the maintaining phase.

As shown in FIGS. 5 and 6, when the pull-up node PU is in a high potential, the transistor T5 is turned on. The low level signal output from the VGL may be applied to the pull-down node PD. When the transistor T6 is turned on, the transistor T4 may be turned off, thereby ensuring that the high level signal output from the VGH may not be applied to the pull-down node PD.

The third control unit controls the fourth transistor T4 to be turned on in the reset phase and the maintaining phase. The high level signal output from the VGH is applied to the pull-down node PD. Since the pull-up node PU is in a low level during the reset phase and the maintaining phase, the transistor T5 is turned off, and the low level signal output from the VGL may not be applied to the pull-down node PD.

Figure 7:
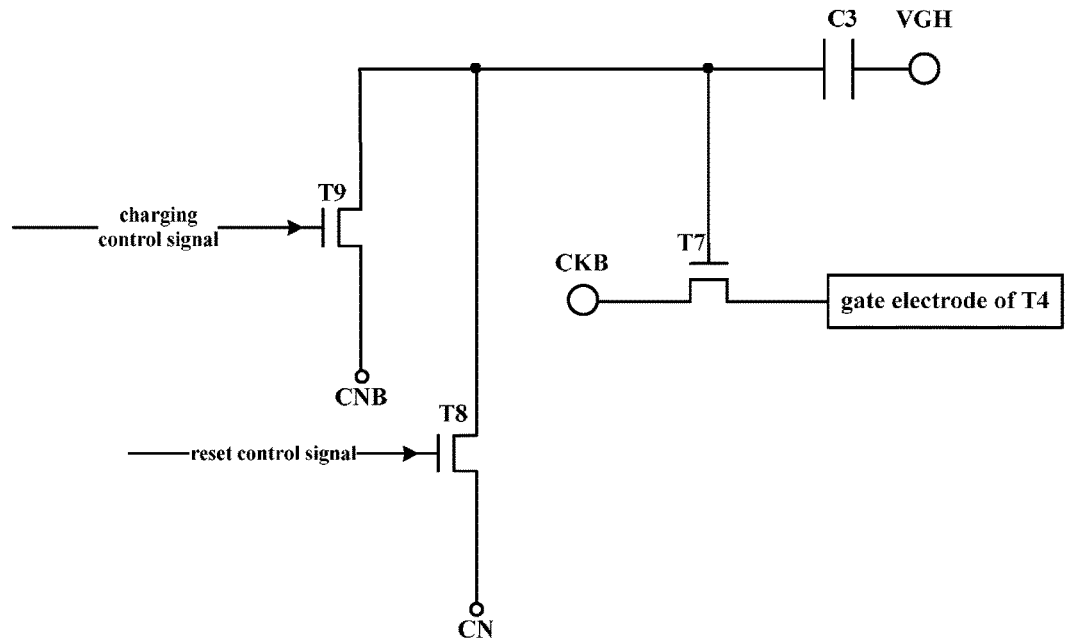
FIG. 7 shows a schematic diagram of a structure of a third control unit in a shift register unit according to an embodiment of the present disclosure.

In the specific embodiment of the present disclosure, the third control unit is shown in FIG. 7 and particularly includes:

a third capacitor structure C3 having one end which is applied with the high level signal;

an eighth transistor T8, wherein a gate electrode of the eighth transistor T8 receives a reset control signal, a source electrode of the eighth transistor T8 receives a first electrical signal CN, and a drain electrode of the eighth transistor T8 is connected to the other end of the third capacitor structure;

a ninth transistor T9, wherein a gate electrode of the ninth transistor T9 receives a charging control signal, a source electrode of the ninth transistor T9 receives a second electrical signal CNB, and a drain electrode of the ninth transistor T9 is connected to the other end of the third capacitor structure, and wherein the first electrical signal CN is a normally high signal or a normally low signal, and the second electrical signal CNB and the first electrical signal CN have inverted phases; and an seventh transistor T7, wherein a gate electrode of the seventh transistor T7 is connected to the other end of the third capacitor structure, a source electrode of the seventh transistor T7 receives a third electrical signal, and a drain electrode of the seventh transistor T7 is connected to the gate electrode of the fourth transistor T4.

The third electrical signal outputs the high level signal at least at the beginning of the reset phase. For example, the following manners may be employed: the third electrical signal may be the high level signal at the beginning of the reset phase and the maintaining phase, and then may be always a high level signal; or the high and low level signals may be alternatively output; or the low level signal may be output after the high level signal is output during a period of time.

Figure 8:
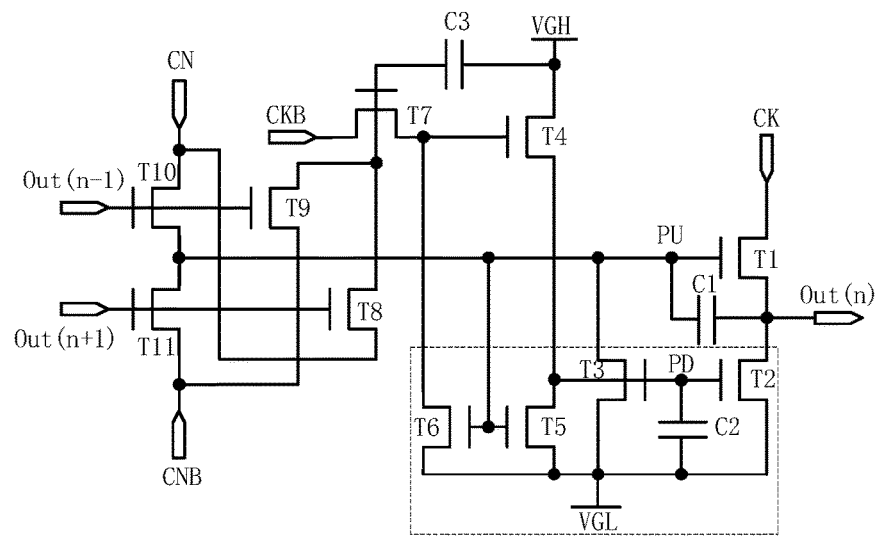
FIG. 8 shows a schematic diagram of a structure of a shift register unit using a N-type transistor according to an embodiment of the present disclosure.
Figure 9:
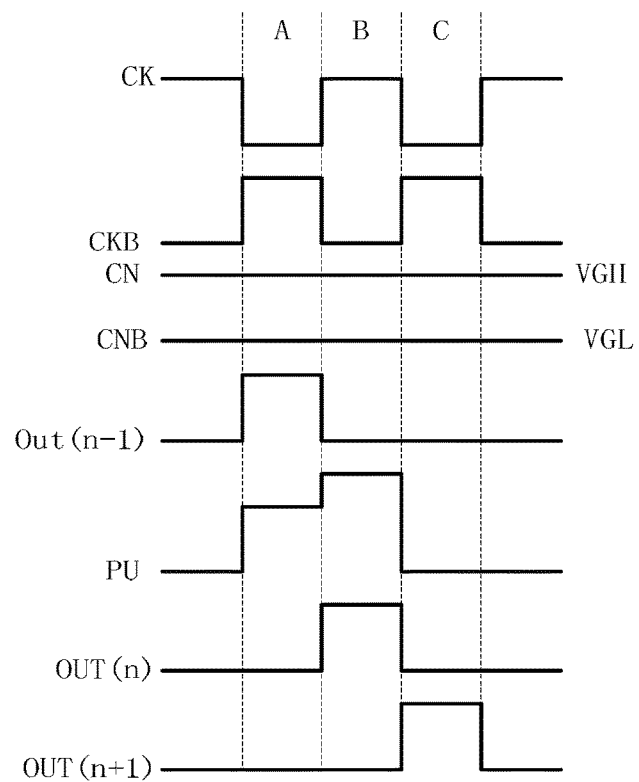
FIG. 9 shows a timing schematic diagram of the shift register unit shown in FIG. 8.

A shift register unit of a specific embodiment of the present disclosure is shown in FIG. 8, and has a timing design shown in FIG. 9. The operation of the shift register unit will be described in detail below with reference to FIGS. 8 and 9.

The first electrical signal CN may be the high level signal (which is consistent with the signal output from the VGH, both of which can be combined to be one). The second electrical signal CNB may be the low level signal (which is consistent with the signal output from the VGL, both of which can be combined to be one). The specific operation of each stage is as follows.

Charging Phase

An output node Out(n−1) of a previous stage and a CKB node output a high level signal. An output node Out(n+1) of a next stage and a CK node output a low level signal. Transistors T9 and T10 are turned on. Transistors T8 and T11 are turned off.

The high level signal which is output as the first electrical signal CN charges a capacitor C1 through a transistor T10, pulls up a level of the pull-up node PU, thereby turning up transistors T5 and T6. A pull-down node PD discharges a capacitor C2 through a transistor T5, such that the pull-down node PD is pulled down to be in a low level state, thereby turning off transistors T2 and T3.

When the transistor T9 is turned on, a capacitor C3 is being charged, and a gate electrode of a transistor T7 is pulled down to be in a low level state. Thus the transistor T7 is turned off, such that the high level of the CKB node may not pass through the transistor T7 and affect a gate electrode of a transistor T4. Meantime, the gate electrode of the transistor T4 is pulled down to be in a low level state by the transistor T6, such that the transistor T4 is turned off. When the transistor T1 is turned on, the CK node outputs the low level signal, and the output node Out(n) of the current stage also outputs the low level signal.

Outputting Phase

The output node Out (n−1) of the previous stage, the output node Out(n+1) of a next stage, and the CKB node output a low level. The transistors T8, T9, T10 and T11 are turned off. The CK node is in a high level. The pull-up node PU is not discharged. The circuit maintains to be in a high level state, such that the transistors T1, T5 and T6 maintain to be turned on. The pull-down node PD still maintains to be in a low level state. The transistors T2, T3, T4, and T7 are still turned off. The transistor T1 is turned on. The high level signal output from the CK node is output to the output node Out(n) of the current stage.

Reset Phase

The output node Out(n+1) of the next stage and the CKB node output a high level signal. The output node Out(n−1) of the previous stage and the CK node output a low level signal, such that the transistors T9 and T10 are turned off, and the transistors T8 and T11 are turned on. The pull-up node PU is pulled down to be in a low level state by the transistor T11, such that the reset of the circuit is completed.

When the pull-up node PU is pulled down to be in a low level state, the transistors T1, T5 and T6 are turned off.

When the transistor T8 is turned on, the high level signal which is output as the first electrical signal CN passes through the transistor T8 and charges the capacitor C3. Also, the gate electrode of the transistor T7 is pulled up to be in a high level state, such that the transistor T7 is turned on.

When the transistor T7 is turned on, the high level signal output from the CKB node pulls up the gate electrode of the transistor T4 to be in a high level state by passing through the transistor T7, such that the transistor T4 is turned on.

When the transistor T4 is turned on, the high level signal output from the VGH node charges the capacitor C2 by passing through the transistor T4 and the pull-down node PD is pulled down to be in a high level state, such that the transistors T2 and T3 are turned on.

When the transistors T2 and T3 are turned on, the output node Out(n) of the current stage and the pull-up node PU are further pulled down to be in a low level state, respectively.

Maintaining Phase

The transistor C3 maintains to be in a high level. When the signal output from the CKB node changes from a low level signal to a high level signal, the gate electrode of the transistor T4 is pulled up once, such that the transistor T4 is also turned on. Thus the high level signal output from the VGH node may charge the transistor C2, such that the pull-down node PD continues to keep the high level. The transistors T2 and T3 maintain a continuous on state to keep pulling down the pull-up node PU and the output end, until the output node Out(n−1) of the previous stage outputs the high level signal again.

Figure 10:
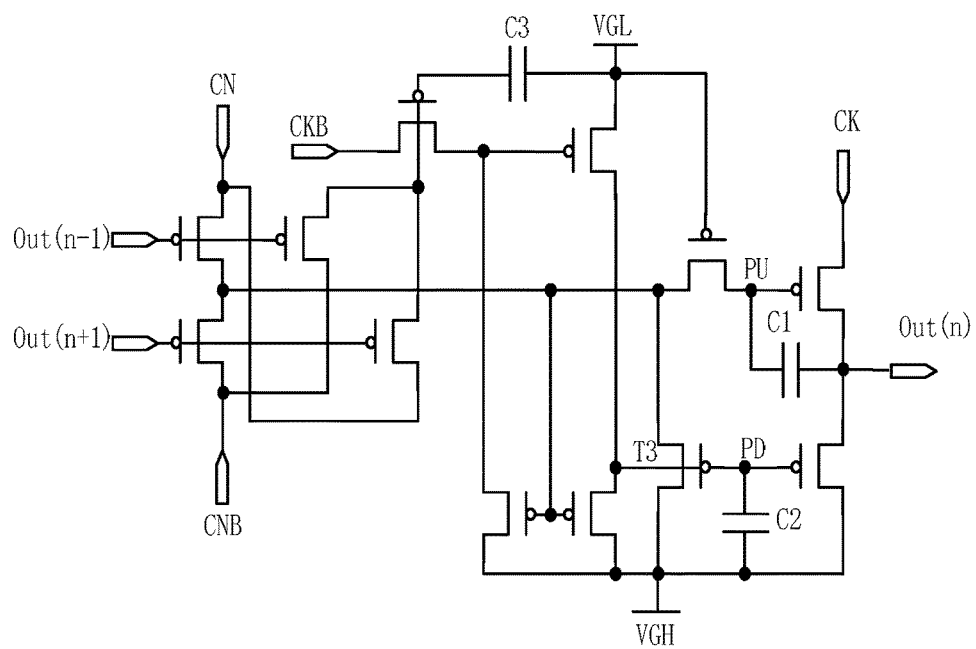
FIG. 10 shows a schematic diagram of a structure of a shift register unit using a P-type transistor according to an embodiment of the present disclosure.

Although the N-type transistor is described above as an example, as shown in FIG. 10, the shift register unit of the embodiment of the present disclosure may also be constructed using a P-type transistor, and the operation principle thereof is identical, thus the description thereof is not repeated herein.

Figure 11:
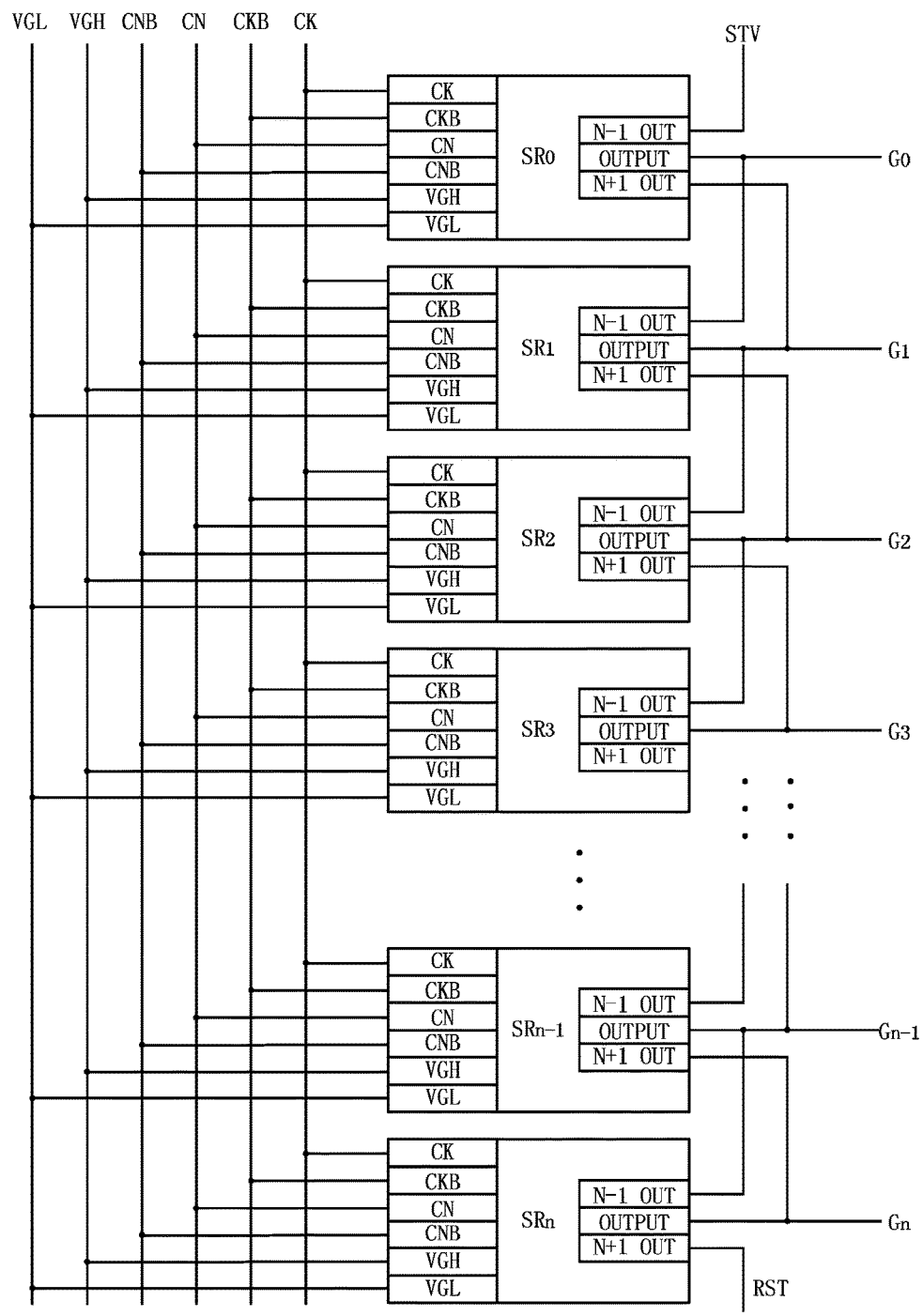
FIG. 11 shows a schematic diagram of a structure of a shift register according to an embodiment of the present disclosure.

FIG. 11 shows a schematic diagram of a structure of a shift register using the shift register unit of an embodiment of the present disclosure. As shown in FIG. 11, the shift register includes multiple stages of shift register units, wherein an output of a previous stage is used as an input of a next stage, and an output of a next stage is fed back to the previous stage for resetting.

In order to achieve the above object, an embodiment of the present disclosure further discloses a gate driving circuit including the shift register described as above.

In order to achieve the above object, an embodiment of the present disclosure further discloses a display device including the gate driving circuit described as above.

The foregoing are intended only as preferred embodiments of the present disclosure and are not intended to be limiting of the present disclosure. Any modifications, equivalent substitutions, improvements, etc., which are within the spirit and principle of the present disclosure, are contained in the scope of the present disclosure.

What is claimed is:

1. A shift register unit having an output node of a current stage, a pull-up node, and a pull-down node, the shift register unit comprising:
a first capacitor module having one end connected to the output node of the current stage and the other end connected to the pull-up node;
a pull-down module, which is controlled by a potential of the pull-down node, and is configured to pull down a potential of the output node of the current stage and a potential of the pull-up node when a circuit of the current stage does not need to output a high level; and
a pull-down control module, configured to output one of a high level signal and a low level signal to the pull-down node in accordance with a current operating phase.

2. The shift register unit of claim 1, further comprising:
a pull-up transistor; and
a current limiting transistor which is normally on, connected between the pull-up node and the pull-up transistor.

3. The shift register unit of claim 1, further comprising:
a second capacitor module, which is charged/discharged by a level signal output from the pull-down control module and maintains a level state of the pull-down node after being charged/discharged.

4. The shift register unit of claim 1, wherein the pull-down control module comprises:
a first control unit, which under a control of the pull-up node outputs the low level signal to the pull-down node during a charging phase and an outputting phase in which the pull-up node is in a high potential, and is turned off during a reset phase and a maintaining phase in which the pull-up node is in a low potential; and
a second control unit, which is turned off when the first control unit outputs the low level signal, and outputs the high level signal to the pull-down node when the first control unit is turned off.

5. The shift register unit of claim 2, wherein the pull-down control module comprises:
a first control unit, which under a control of the pull-up node outputs the low level signal to the pull-down node during a charging phase and an outputting phase in which the pull-up node is in a high potential, and is turned off during a reset phase and a maintaining phase in which the pull-up node is in a low potential; and
a second control unit, which is turned off when the first control unit outputs the low level signal, and outputs the high level signal to the pull-down node when the first control unit is turned off.

6. The shift register unit of claim 3, wherein the pull-down control module comprises:
a first control unit, which under a control of the pull-up node outputs the low level signal to the pull-down node during a charging phase and an outputting phase in which the pull-up node is in a high potential, and is turned off during a reset phase and a maintaining phase in which the pull-up node is in a low potential; and
a second control unit, which is turned off when the first control unit outputs the low level signal, and outputs the high level signal to the pull-down node when the first control unit is turned off.

7. The shift register unit of claim 4, wherein the first control unit comprises a fifth transistor, wherein a gate electrode of the fifth transistor is connected to the pull-up node, a source electrode of the fifth transistor receives the low level signal, and a drain electrode of the fifth transistor is connected to the pull-down node.

8. The shift register unit of claim 7, wherein the second control unit comprises:
a sixth transistor, wherein a gate electrode of the sixth transistor is connected to the pull-up node, and a source electrode of the sixth transistor receives the low level signal;
a fourth transistor, wherein a drain electrode of the fourth transistor receives the high level signal, a gate electrode of the fourth transistor is connected to the drain electrode of the sixth transistor, and a source electrode of the fourth transistor is connected to the pull-down node; and
a third control unit, configured to output the high level signal to the pull-down node by controlling the fourth transistor during the reset phase and the maintaining phase.

9. The shift register unit of claim 8, wherein the third control unit comprises:
a third capacitor structure, one end of which is inputted with the high level signal;
an eighth transistor, wherein a gate electrode of the eighth transistor receives a reset control signal, a source electrode of the eighth transistor receives a first electrical signal, and a drain electrode of the eighth transistor is connected to the other end of the third capacitor structure;
a ninth transistor, wherein a gate electrode of the ninth transistor receives a charging control signal, a source electrode of the ninth transistor receives a second electrical signal, and a drain electrode of the ninth transistor is connected to the other end of the third capacitor structure, and wherein the first electrical signal is a normally high signal or a normally low signal, and the second electrical signal and the first electrical signal have inverted phases; and a seventh transistor, wherein a gate electrode of the seventh transistor is connected to the other end of the third capacitor structure, a source electrode of the seventh transistor receives a third electrical signal, and a drain electrode of the seventh transistor is connected to the gate electrode of the fourth transistor, and wherein the third electrical signal outputs the high level signal at least at the beginning of the reset phase.

10. The shift register unit of claim 5, wherein the first control unit comprises a fifth transistor, wherein a gate electrode of the fifth transistor is connected to the pull-up node, a source electrode of the fifth transistor receives the low level signal, and a drain electrode of the fifth transistor is connected to the pull-down node.

11. The shift register unit of claim 10, wherein the second control unit comprises:

a sixth transistor, wherein a gate electrode of the sixth transistor is connected to the pull-up node, and a source electrode of the sixth transistor receives the low level signal;

a fourth transistor, wherein a drain electrode of the fourth transistor receives the high level signal, a gate electrode of the fourth transistor is connected to the drain electrode of the sixth transistor, and a source electrode of the fourth transistor is connected to the pull-down node; and a third control unit, configured to output the high level signal to the pull-down node by controlling the fourth transistor during the reset phase and the maintaining phase.

12. The shift register unit of claim 11, wherein the third control unit comprises:

a third capacitor structure, one end of which is inputted with the high level signal;

an eighth transistor, wherein a gate electrode of the eighth transistor receives a reset control signal, a source electrode of the eighth transistor receives a first electrical signal, and a drain electrode of the eighth transistor is connected to the other end of the third capacitor structure;

a ninth transistor, wherein a gate electrode of the ninth transistor receives a charging control signal, a source electrode of the ninth transistor receives a second electrical signal, and a drain electrode of the ninth transistor is connected to the other end of the third capacitor structure, and wherein the first electrical signal is a normally high signal or a normally low signal, and the second electrical signal and the first electrical signal have inverted phases; and a seventh transistor, wherein a gate electrode of the seventh transistor is connected to the other end of the third capacitor structure, a source electrode of the seventh transistor receives a third electrical signal, and a drain electrode of the seventh transistor is connected to the gate electrode of the fourth transistor, and wherein the third electrical signal outputs the high level signal at least at the beginning of the reset phase.

13. The shift register unit of claim 6, wherein the first control unit comprises a fifth transistor, wherein a gate electrode of the fifth transistor is connected to the pull-up node, a source electrode of the fifth transistor receives the low level signal, and a drain electrode of the fifth transistor is connected to the pull-down node.

14. The shift register unit of claim 13, wherein the second control unit comprises:

a sixth transistor, wherein a gate electrode of the sixth transistor is connected to the pull-up node, and a source electrode of the sixth transistor receives the low level signal;

a fourth transistor, wherein a drain electrode of the fourth transistor receives the high level signal, a gate electrode of the fourth transistor is connected to the drain electrode of the sixth transistor, and a source electrode of the fourth transistor is connected to the pull-down node; and a third control unit, configured to output the high level signal to the pull-down node by controlling the fourth transistor during the reset phase and the maintaining phase.

15. The shift register unit of claim 14, wherein the third control unit comprises:

a third capacitor structure, one end of which is inputted with the high level signal;

an eighth transistor, wherein a gate electrode of the eighth transistor receives a reset control signal, a source electrode of the eighth transistor receives a first electrical signal, and a drain electrode of the eighth transistor is connected to the other end of the third capacitor structure;

a ninth transistor, wherein a gate electrode of the ninth transistor receives a charging control signal, a source electrode of the ninth transistor receives a second electrical signal, and a drain electrode of the ninth transistor is connected to the other end of the third capacitor structure, and wherein the first electrical signal is a normally high signal or a normally low signal, and the second electrical signal and the first electrical signal have inverted phases; and a seventh transistor, wherein a gate electrode of the seventh transistor is connected to the other end of the third capacitor structure, a source electrode of the seventh transistor receives a third electrical signal, and a drain electrode of the seventh transistor is connected to the gate electrode of the fourth transistor, and wherein the third electrical signal outputs the high level signal at least at the beginning of the reset phase.

16. The shift register unit of claim 1, wherein the high level signal and the low level signal are outputted to the pull-down node through different electrical transmission channels.

17. A shift register comprising a plurality of shift register units, wherein the shift register unit having an output node of a current stage, a pull-up node, and a pull-down node, the shift register unit comprising:

a first capacitor module having one end connected to the output node of the current stage and the other end connected to the pull-up node;

a pull-down module, which is controlled by a potential of the pull-down node, and is configured to pull down a potential of the output node of the current stage and a potential of the pull-up node when a circuit of the current stage does not need to output a high level; and a pull-down control module, configured to output one of a high level signal and a low level signal to the pull-down node in accordance with a current operating phase, wherein the plurality of the shift register units are cascaded with each other.

18. The shift register of claim 17, wherein each of the plurality of the shift register units further comprises:

a pull-up transistor; and a current limiting transistor which is normally on, connected between the pull-up node and the pull-up transistor.

19. A gate driving circuit comprising the shift register of claim 17.

20. A display device comprising the gate driving circuit of claim 19.

* * * * *